United States Patent
Sato et al.

(10) Patent No.: US 8,394,731 B2
(45) Date of Patent: Mar. 12, 2013

(54) COMPOSITE WOVEN FABRIC AND PRINTED WIRING BOARD

(75) Inventors: Akira Sato, Tokyo (JP); Akira Fujinoki, Fukushima (JP); Hiroyuki Nishimura, Fukushima (JP); Tsukasa Sakaguchi, Fukushima (JP)

(73) Assignee: Shin-Etsu Quartz Products Co., Ltd. (JP)

( * ) Notice: Subject to any disclaimer, the term of this patent is extended or adjusted under 35 U.S.C. 154(b) by 538 days.

(21) Appl. No.: 12/447,653

(22) PCT Filed: Nov. 7, 2007

(86) PCT No.: PCT/JP2007/071641
§ 371 (c)(1),
(2), (4) Date: Apr. 28, 2009

(87) PCT Pub. No.: WO2008/059741
PCT Pub. Date: May 22, 2008

(65) Prior Publication Data
US 2010/0065316 A1    Mar. 18, 2010

(30) Foreign Application Priority Data
Nov. 13, 2006    (JP) .................................. 2006-306465

(51) Int. Cl.
*D03D 15/00*    (2006.01)
(52) U.S. Cl. .......... 442/301; 442/197; 442/198; 428/901
(58) Field of Classification Search .......... 442/197–198, 442/301
See application file for complete search history.

(56) References Cited

U.S. PATENT DOCUMENTS
4,937,132 A * 6/1990 Gaku et al. .................... 428/209

FOREIGN PATENT DOCUMENTS

| CN | 1291963 A | 4/2001 |
|---|---|---|
| CN | 1474790 A | 2/2004 |
| JP | 63-002831 | 1/1988 |
| JP | 02-061131 | 3/1990 |
| JP | 03-124838 | 5/1991 |
| JP | 10-310967 | 11/1998 |
| JP | 2004-099377 | 4/2004 |
| JP | 2006-282401 | 10/2006 |
| JP | 2006-527152 | 11/2006 |
| WO | 99/44959 A | 9/1999 |
| WO | WO 2004/110951 A1 | 12/2004 |

OTHER PUBLICATIONS

Shizhun, Q., "Development trends of glass fiber textile products," Fiber Glass, Issue 5, 2001, pp. 14-18.

* cited by examiner

*Primary Examiner* — Lynda Salvatore
(74) *Attorney, Agent, or Firm* — Marger Johnson & McCollom, P.C.

(57) ABSTRACT

Disclosed is a printed wiring board which attains aims of printed wiring boards required for realizing high-speed, high-frequency semiconductor devices, namely a printed wiring board having low dielectric constant, low dielectric loss tangent and low linear expansion coefficient. Also disclosed is a composite woven fabric suitably used as a base material for such a printed wiring board. Specifically disclosed is a composite woven fabric containing quartz glass fibers and polyolefin fibers, in which the ratio of the quartz glass fibers to the composite woven fabric is set at 10 vol % or more and 90 vol % or less. It is preferred that the quartz glass fibers each have a filament diameter of 3 μm or more and 16 μm or less, and the composite woven fabric has a thickness of 200 μm or less.

11 Claims, 3 Drawing Sheets

COMPOSITE WOVEN FABRIC AND PRINTED WIRING BOARD

TECHNICAL FIELD

The present invention relates to a composite woven fabric suitably used in a printed wiring board used in an electrical and electronic field, and a printed wiring board, in particular, a composite woven fabric suitably used in each of a high-frequency printed wiring board and an advanced multilayer printed wiring board, and a printed wiring board using the composite woven fabric.

BACKGROUND ART

An increase in speed of a multilayer printed wiring board to be used in a computer or peripheral device has progressed in recent years in association with an increase in speed of a semiconductor device. Further, there has been a growing request for high-speed, large-capacity transmission by a communication instrument or broadcasting instrument in association with rapid widespread of the internet and mobile phones. In view of the foregoing, an improvement in high-frequency characteristic has been needed in such multilayer printed wiring board. In particular, attention has been paid on problems involved in an advanced multilayer printed wiring board to be used in a high-frequency region exceeding 1 GHz such as transmission loss and circuit delay.

A glass cloth using E glass fibers is generally used as a base material conventionally used in a printed wiring board. A laminated plate is produced by impregnating the glass cloth with a thermosetting resin such as an epoxy resin or a phenol resin and molding the resultant under heat and pressure.

However, a low dielectric constant and a low dielectric loss tangent are requested of a high-frequency printed wiring board in which a high-speed semiconductor device is implemented. In view of the foregoing, a D glass fiber (Patent Document 1), thermosetting PPE resin, or the like excellent in electrical characteristics has started to be used instead of the conventional combination of an E glass fiber and an epoxy resin or phenol resin, or the like.

However, the D glass fiber has currently become obsolete owing to its problems described below: the fiber is poor in productivity owing to its high melting temperature, and, furthermore, the fiber is poor in drilling property when turned into a printed wiring board because the fiber has a high $SiO_2$ content. In view of the foregoing, an NE glass fiber having drilling property comparable to that of an E glass fiber while maintaining a low dielectric constant and a low dielectric loss tangent has been developed. However, an additional increase in frequency at which a printed wiring board can be used has been advanced, and a base material for a printed wiring board more excellent in electrical characteristics than the NE glass fiber has been requested.

In addition, a printed wiring board composed of a fluorine-based resin has been conventionally used as a high-frequency printed wiring board in many cases. In addition, the fluorine-based resin board has been used as a single-sided board or double-sided board in most of the cases because it is difficult to turn the board into multiple layers. However, there has been a growing request for an increase in number of layers even in a high-frequency printed wiring board these days.

A quartz glass fiber having the lowest relative dielectric constant and the lowest dielectric loss tangent out of the glass fibers is expected to be a base material for a printed wiring board, and an investigation has been conducted on the introduction of the fiber. However, the quartz glass fiber involves the following problem: the fiber is so hard that it is difficult to subject a multilayer printed wiring board composed of the fiber to boring with a drill or cutting. In view of the foregoing, a proposal has been made for improving the drilling property of the fiber (Patent Document 2). However, a quartz glass fiber improved as a result of the proposal is so expensive as to find use only in a few special applications.

In addition, an invention concerning a woven fabric for a printed wiring board composed of E glass, D glass, and silica fibers, and polytetrafluoroethylene fibers has been disclosed (Patent Document 3). Although the polytetrafluoroethylene fibers used in the woven fabric are each excellent in dielectric characteristic, and each have high heat resistance, the fibers are expensive, so limitations are imposed on the use of the fibers in a general-purpose printed wiring board as in the case of a quartz glass cloth. As a result, the fibers find use only in a few special applications.

A method of implementing a semiconductor device in a printed wiring board has been changing in association with an increase in speed of the device. A wire bonding method has been conventionally employed, but it is difficult for the wire bonding method to correspond to the progress of: a finer wiring pitch; a finer electrode; and an increase in information processing speed. A flip chip method involving joining a device and a board with a projecting electrode called a bump has started to be employed instead of the above method.

In implementation by the flip chip method, a remarkable difference in linear expansion coefficient between the device and the printed wiring board may be responsible for a wiring failure, so the development of a low linear expansion coefficient printed wiring board corresponding to the flip chip method has been demanded.

The low linear expansion coefficient printed wiring board generally achieves its low linear expansion coefficient by being mixed with a silica-based filler at a high ratio. However, a phenomenon called a powder fall in which the filler falls from the portion at which the board is processed with a drill or the like occurs, and is perceived as a problem. In view of the foregoing, a reduction in linear expansion coefficient of a base material for a printed wiring board has been requested.

The quartz glass fiber is an example of a base material having a low linear expansion coefficient, but some problems must be solved owing to the above reasons.

Further, a glass cloth with its linear expansion coefficient improved by interlacing the E glass and a glass fiber having specific composition at a specific ratio has been proposed as a prior art (for example, Patent Document 4). However, the glass cloth cannot provide sufficient characteristics.

Patent Document 1: JP 63-2831 A
Patent Document 2: JP 2004-99377 A
Patent Document 3: JP 2-61131 A
Patent Document 4: JP 10-310967 A

DISCLOSURE OF THE INVENTION

Problems to be Solved by the Invention

An object of the present invention is to provide a printed wiring board capable of achieving a low dielectric constant, a low dielectric loss tangent, and a low linear expansion coefficient requested of a printed wiring board in association with increases in speed and frequency of a semiconductor device, and a composite woven fabric to be suitably used as a base material for the printed wiring board.

Means for Solving the Problems

The inventors of the present invention have made extensive studies with a view to solving the above problems. As a result, the inventors have found that: a composite woven fabric excellent in electrical and thermal characteristics can be obtained by combining or uniting a quartz glass fiber and a polyolefin fiber; and a printed wiring board capable of achieving a low dielectric constant, a low dielectric loss tangent, and a low linear expansion coefficient can be obtained by using the composite woven fabric.

That is, the composite woven fabric of the present invention is a composite woven fabric containing quartz glass fibers and polyolefin fibers, in which a ratio of the quartz glass fibers to the composite woven fabric is 10 vol. % or more and 90 vol. % or less.

It is preferred that the quartz glass fibers each have a filament diameter of 3 µm or more and 16 µm or less, the composite woven fabric has a thickness of 200 µm or less, and the weight per unit area of the composite woven fabric is 200 g/m$^2$ or less.

The quartz glass fibers are preferably quartz glass fibers produced by drawing a quartz glass rod under heat. In addition, it is preferred that the quartz glass fibers each have a relative dielectric constant of 3.9 or less at 1 MHz and a relative dielectric constant of 4.0 or less at 1 GHz, and the quartz glass fibers each have a dielectric loss tangent of $1.5 \times 10^{-4}$ or less at 1 MHz and a dielectric loss tangent of $2.0 \times 10^{-4}$ or less at 1 GHz.

The polyolefin fibers are preferably polyethylene fibers, polypropylene fibers, or polystyrene fibers. In addition, the polyolefin fibers each preferably have a relative dielectric constant of 3.0 or less and a dielectric loss tangent of $3 \times 10^{-3}$ or less at 1 MHz.

The composite woven fabric is preferably woven from combined filament yarns of the quartz glass fibers and the polyolefin fibers.

The composite woven fabric is preferably a union fabric of quartz glass fiber strands and polyolefin fiber strands.

The composite woven fabric is preferably a union fabric of combined filament yarns of the quartz glass fibers and the polyolefin fibers, and quartz glass fiber strands and/or polyolefin fiber strands.

The composite woven fabric of the present invention is particularly preferably used for a printed wiring board. The composite woven fabric preferably has a relative dielectric constant of 4.0 or less and a dielectric loss tangent of $3 \times 10^{-3}$ or less at from 1 MHz to 10 GHz.

The printed wiring board of the present invention is a printed wiring board obtained by using the composite woven fabric of the present invention. The printed wiring board of the present invention preferably has a relative dielectric constant of 4.0 or less and a dielectric loss tangent of $3 \times 10^{-3}$ or less at from 1 MHz to 10 GHz.

Effects of the Invention

The composite woven fabric of the present invention is excellent in electrical and thermal characteristics, and is particularly suitable for use in a printed wiring board. In addition, according to the present invention, there can be provided a printed wiring board which: is available at a low cost; is excellent in drilling property; and is capable of achieving a low dielectric constant, a low dielectric loss tangent, and a low linear expansion coefficient. Further, according to the present invention, an increase in number of layers of a printed wiring board, and reductions in weight and cost of the printed wiring board can be achieved.

DESCRIPTION OF REFERENCE NUMERALS

Figure 1:
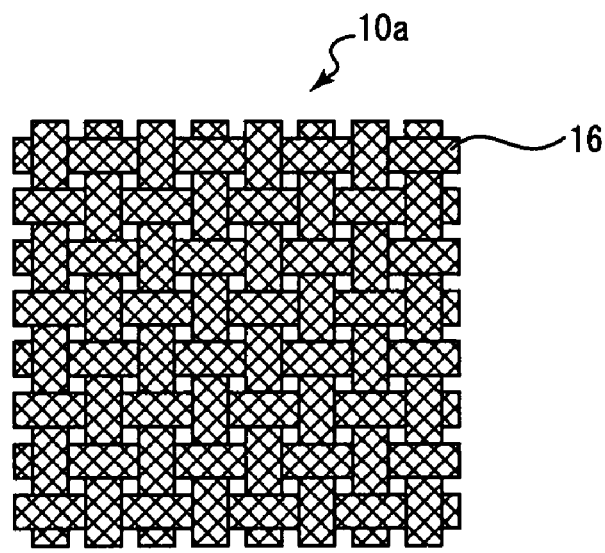
FIG. 1 is an outline explanatory view showing a first example of a composite woven fabric of the present invention.

10*a*, 10*b*, 10*c*, 10*d*, 10*e*: composite woven fabrics of the present invention, 12: a quartz glass fiber strand, 14: a polyolefin fiber strand, 16: a combined filament yarn.

BEST MODE FOR CARRYING OUT THE INVENTION

Hereinafter, an embodiment of the present invention will be described with reference to the attached drawings. However, the shown examples are merely exemplary, and it goes without saying that various modifications can be made as long as the modifications do not deviate from the technical idea of the present invention.

FIGS. 1 to 5 are outline explanatory views showing first to fifth examples of a composite woven fabric of the present invention. In FIGS. 1 to 5, reference numerals 10*a*, 10*b*, 10*c*, 10*d*, and 10*e* each represent the composite woven fabric of the present invention, reference numeral 12 represents a quartz glass fiber strand composed of a quartz glass fiber, reference numeral 14 represents a polyolefin fiber strand composed of a polyolefin fiber, and reference numeral 16 represents a combined filament yarn of a quartz glass fiber and a polyolefin fiber.

The composite woven fabric of the present invention is a composite woven fabric containing quartz glass fibers and polyolefin fibers. A ratio of the quartz glass fibers to the composite woven fabric is 10 vol. % or more and 90 vol. % or less. The composite woven fabric is suitably used for a printed wiring board.

It should be noted that the ratio of the quartz glass fibers to the composite woven fabric in the present invention is calculated from the volumes of the quartz glass fibers and the polyolefin fibers used, and a composite woven fabric containing the quartz glass fibers and the polyolefin fibers used at desired contents can be obtained by adjusting a ratio between the fibers.

Quartz glass fibers obtained by drawing a natural quartz glass, which is obtained by melting quartz as a natural mineral under heat, or a synthetic quartz glass, which is obtained by hydrolyzing a silicon compound such as silicon tetrachloride, under heat are suitably used as the quartz glass fibers to be used in the present invention.

In addition, a silane coupling agent is preferably used as a sizing agent at the time of the spinning or twisting of the quartz glass fibers to be used in the present invention. In general, a woven fabric for a printed wiring board is treated with a silane coupling agent as a surface treatment agent so that an adhesive strength between the woven fabric and a thermosetting resin to be composited with the woven fabric may be improved; prior to the treatment, for example, heat cleaning intended for the removal of a sizing agent adhering to glass fibers is performed. It is not preferred that a heat cleaning treatment be performed for the composite woven fabric of the present invention because the composite woven fabric contains the polyolefin fibers each having a low melting point; the use of a silane coupling agent as a sizing agent can eliminate the need for the heat cleaning treatment.

The relative dielectric constant and dielectric loss tangent of each of the quartz glass fibers are preferably low; specifically, the quartz glass fibers each preferably have a relative dielectric constant of 3.9 or less at 1 MHz, a relative dielectric constant of 4.0 or less at 1 GHz, a dielectric loss tangent of $1.5 \times 10^{-4}$ or less at 1 MHz, and a dielectric loss tangent of $2.0 \times 10^{-4}$ or less at 1 GHz. The lower the relative dielectric constant and the dielectric loss tangent, the better; there is no particular lower limit for each of the relative dielectric constant and the dielectric loss tangent. Quartz glass fibers each having a relative dielectric constant of 3.0 or more at from 1 MHz to 1 GHz and a dielectric loss tangent of $0.5 \times 10^{-4}$ or more at from 1 MHz to 1 GHz are currently available.

Although the OH group concentration of each of the quartz glass fibers is not particularly limited, quartz glass fibers each having a low OH group concentration are preferred because each of the relative dielectric constant and the dielectric loss tangent reduces as the OH group concentration reduces.

Polyolefin used in the polyolefin fibers to be used in the present invention is, for example, a polymer of an olefinic hydrocarbon such as ethylene, propylene, or styrene, a copolymer mainly composed of the olefinic hydrocarbon, or a mixture of them.

Each of a single fiber and a composite fiber can be used as each of the polyolefin fibers. When composite fibers are used, fiber composition is not particularly limited, and, for example, sheath-core type composite fibers in each of which a core component and a sheath component are different from each other in composition, or side-by-side type composite fibers in each of which two components are joined can be used. The polyolefin fibers are preferably polyethylene fibers, polypropylene fibers, or polystyrene fibers.

The relative dielectric constant and dielectric loss tangent of each of the polyolefin fibers are preferably low; specifically, the polyolefin fibers each preferably have a relative dielectric constant of 3.0 or less at 1 MHz and a dielectric loss tangent of $3 \times 10^3$ or less at 1 MHz. The lower the relative dielectric constant and the dielectric loss tangent, the better; there is no particular lower limit for each of the relative dielectric constant and the dielectric loss tangent. Polyolefin fibers each having a relative dielectric constant of 1.5 or more at 1 MHz and a dielectric loss tangent of $0.5 \times 10^{-4}$ or more at 1 MHz are currently available.

It should be noted that, in the present invention, the relative dielectric constant and the dielectric loss tangent were measured in a bulk body of a quartz glass and polyolefin in conformance with JIS R1641 "Method of testing fine ceramic substrate for microwave dielectric characteristic" by a cavity resonance method.

The thickness of each of the strands to be used in the composite woven fabric of the present invention, the number of the strands, the number of twists of the strands, and the like are not particularly limited, and can be appropriately selected as required. The weaving density and dimensions of the composite woven fabric, and the manner in which the composite woven fabric is woven are not particularly limited; examples of the manner include a plain weave, a twill weave, a satin weave, and a leno weave, and the plain weave is particularly suitable.

In the composite woven fabric of the present invention, the manner in which the quartz glass fibers and the polyolefin fibers are used as a mixture is not particularly limited, and examples of the manner include commingling and uniting or combined weaving. The manner can be appropriately selected so that a volume ratio of the quartz glass fibers to the composite woven fabric may fall within the range of 10 to 90%. For example, as shown in FIG. 1, the composite woven fabric may be a composite woven fabric 10a woven by using combined filament yarns 16 obtained by combining the quartz glass fibers and the polyolefin fibers. Alternatively, as shown in FIGS. 2 to 5, the composite woven fabric may be any one of union fabrics 10b to 10e each obtained by uniting the quartz glass fiber strands 12 composed of the quartz glass fibers and the polyolefin fiber strands 14 composed of the polyolefin fibers. Alternatively, although not shown, the composite woven fabric may be a union fabric obtained by uniting the combined filament yarns 16 and the quartz glass fiber strands 12, a union fabric obtained by uniting the combined filament yarns 16 and the polyolefin fiber strands 14, or a union fabric obtained by uniting the combined filament yarns 16, the quartz glass fiber strands 12, and the polyolefin fiber strands 14. Of those, the composite woven fabric 10a composed of the combined filament yarns 16 is preferred because the fabric can be easily woven.

When the composite woven fabric is woven by using the quartz glass fiber strands 12 and the polyolefin fiber strands 14, the array of vertical strands and horizontal strands is not particularly limited. One of the vertical strands and the horizontal strands may be constituted of the quartz glass fiber strands 12, and the other may be constituted of the polyolefin fiber strands 14. Alternatively, both the vertical strands and the horizontal strands may be constituted of the quartz glass fiber strands 12 and the polyolefin fiber strands 14. Alternatively, one of the vertical strands and the horizontal strands may be constituted of the quartz glass fiber strands 12 and the polyolefin fiber strands 14, and the other may be constituted of the quartz glass fiber strands 12 or the polyolefin fiber strands 14. As shown in each of FIGS. 2 to 5, both the vertical strands and the horizontal strands preferably contain the quartz glass fiber strands 12 and the polyolefin fiber strands 14.

Figure 2:
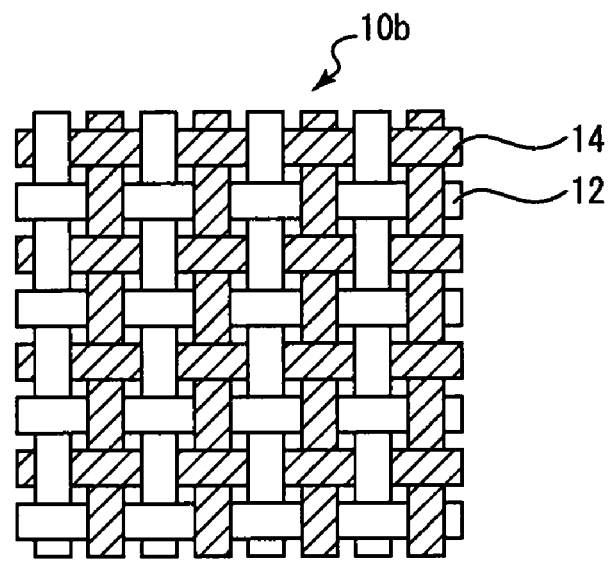
FIG. 2 is an outline explanatory view showing a second example of the composite woven fabric of the present invention.
Figure 3:
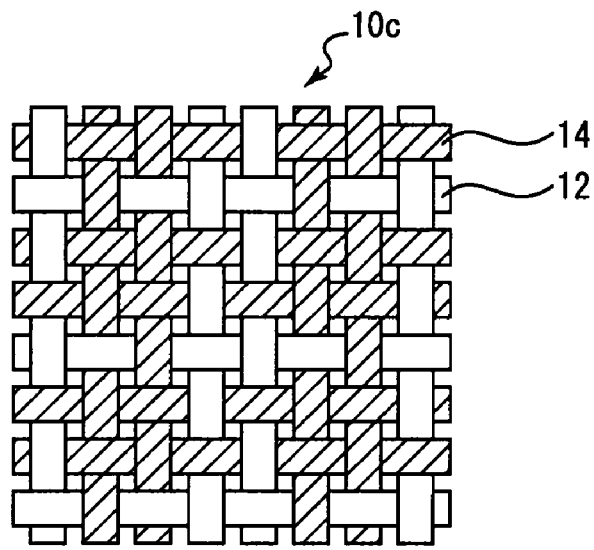
FIG. 3 is an outline explanatory view showing a third example of the composite woven fabric of the present invention.
Figure 4:
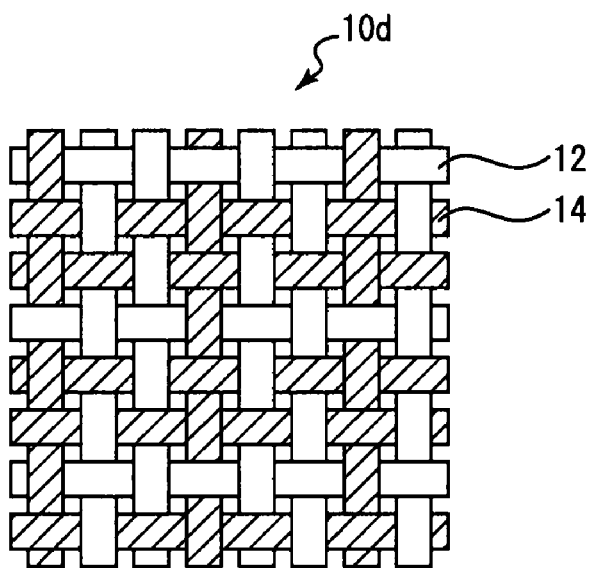
FIG. 4 is an outline explanatory view showing a fourth example of the composite woven fabric of the present invention.
Figure 5:
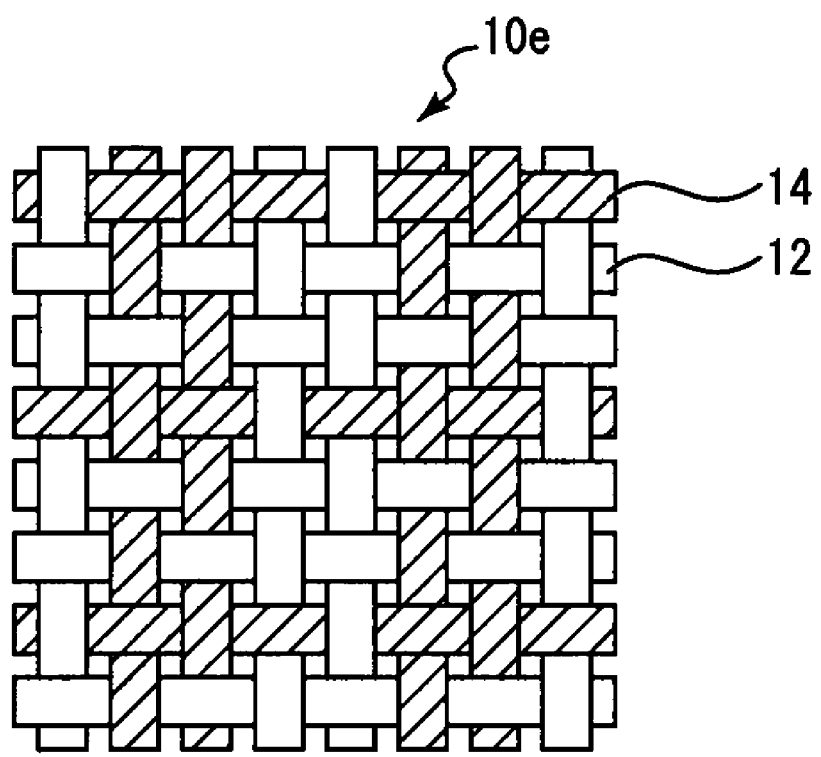
FIG. 5 is an outline explanatory view showing a fifth example of the composite woven fabric of the present invention.

FIG. 2 shows a schematic view of the composite woven fabric 10b in which both the vertical strands and the horizontal strands contain the quartz glass fiber strands 12 and the polyolefin fiber strands 14 at equal ratios. FIG. 3 shows a schematic view of the composite woven fabric 10c in which both the vertical strands and the horizontal strands contain the polyolefin fiber strands 14 at a larger ratio than that of the quartz glass fiber strands 12. FIG. 4 shows a schematic view of the composite woven fabric 10d in which the vertical strands contain the quartz glass fiber strands 12 at a larger ratio than that of the polyolefin fiber strands 14, and the horizontal strands contain the polyolefin fiber strands 14 at a larger ratio than that of the quartz glass fiber strands 12. FIG. 5 shows a schematic view of the composite woven fabric 10e in which the vertical strands contain the polyolefin fiber strands 14 at a larger ratio than that of the quartz glass fiber strands 12, and the horizontal strands contain the quartz glass fibers strands 12 at a larger ratio than that of the polyolefin fiber strands 14. A ratio between the respective fiber strands in each of the vertical strands and the horizontal strands can be appropriately selected so that a volume ratio of the quartz glass fibers to the composite woven fabric may fall within the range of 10 to 90%.

The thickness of the composite woven fabric of the present invention, which is not particularly limited, is preferably 200 or less in order that a multilayer board may be produced, and is more preferably 100 μm or less in order that an increase in number of layers may be performed. In addition, the thickness of the composite woven fabric is preferably 10 μm or more in order that the composite woven fabric may be prevented from deforming in production steps for a printed wiring board.

The composite woven fabric of the present invention is preferably light in terms of a reduction in weight of a board; specifically, the weight of the composite woven fabric is preferably 200 g/m$^2$ or less.

The filaments of the quartz glass fibers and the polyolefin fibers can be arbitrarily selected depending on the thickness and density of a woven fabric to be produced; filament diameters and the number of filaments suitable for the production of a woven fabric having a thickness of 200 μm or less are preferably selected. The filaments of the quartz glass fibers each preferably have a diameter of 3 μm or more and 16 μm or less, and the filaments of the polyolefin fibers each preferably have a diameter of 3 μm or more and 50 μm or less.

When combined weaving is performed by using the quartz glass fiber strands and the polyolefin fiber strands, the thicknesses of the respective strands are preferably similar to each other. The use of strands having similar thicknesses can secure the uniformity of the thickness of the woven fabric to be produced. A strand constituted of quartz glass fibers and polyolefin fibers similar to each other in filament diameter and number is more preferred. However, it is relatively difficult to obtain thin polyolefin fibers each having a diameter of 15 μm or less, so a woven fabric having desired characteristics can be obtained as long as the thicknesses of the strands are similar to each other.

In addition, in the case of commingling, a quartz glass fiber and a polyolefin fiber are mixed in one strand, so each of the fibers can be incorporated into the strand at a predetermined ratio.

A ratio between the quartz glass fibers and the polyolefin fibers in the composite woven fabric of the present invention is such that a volume ratio of the quartz glass fibers to the composite woven fabric falls within the range of 10% to 90%.

Adjusting the ratio between the quartz glass fibers and the polyolefin fibers allows one to adjust the linear expansion coefficient of the composite woven fabric of the present invention. Since a quartz glass has an extremely small linear expansion coefficient, a base material having a linear expansion coefficient suitable for a printed wiring board can be obtained even when a ratio of the polyolefin fibers to the composite woven fabric is considerably large.

The linear expansion coefficient of the composite woven fabric of the present invention is suitably nearly equal to or smaller than that of a copper foil, though the suitable value varies depending on the applications of the printed wiring board and a method of implementing a device in the printed wiring board. The ratio of the quartz glass fibers can be adjusted to such an extent that the linear expansion coefficient of the printed wiring board is acceptable, though the adjustable range varies depending on the characteristics of a thermosetting resin to be composited with the woven fabric for producing the printed wiring board.

A printed wiring board of the present invention is produced by using the composite woven fabric of the present invention. A method of producing the printed wiring board of the present invention is not particularly limited, and the printed wiring board can be produced with the composite woven fabric of the present invention as a base material by an ordinary method. For example, the printed wiring board can be produced by: (1) a prepreg production step involving impregnating the base material composed of the composite woven fabric of the present invention with varnish containing, for example, a thermosetting resin and a solvent and drying the resultant under heat to produce a prepreg; (2) a laminated plate production step involving laminating one or more prepregs of the above kind, superimposing a metal foil such as a copper foil on one side, or each of both sides, of the resultant as required, and curing the resultant under heat and pressure to produce a laminated plate, or preferably a copper-clad laminated plate; and (3) a printed wiring board production step involving forming a circuit pattern in the metal foil of the laminated plate by photolithography and etching, plating, or the like.

A known thermosetting resin to be used in a prepreg can be used as the thermosetting resin used in the printed wiring board, and examples of the resin include a phenol resin and an epoxy resin. When one wishes to obtain a high-frequency printed wiring board, the thermosetting resin is also preferably excellent in electrical characteristics, in particular, a relative dielectric constant and a dielectric loss tangent, and examples of such resin include a polyphenylene ether resin and a bismaleimide-triazine resin.

A multilayer printed wiring board can be produced by using the above-mentioned printed wiring board as a core base material and the above-mentioned prepreg. Preferably performed is, for example, a build-up step involving superimposing one or more prepregs of the above kind on the surface layer of the double-sided printed wiring board as a core board, and superimposing copper foils on both sides of the resultant, or involving alternately placing the core board and the prepreg, and curing the resultant under heat and pressure to cause the core board and the prepreg to adhere to each other.

A printed circuit can be obtained by using the above-mentioned printed wiring board by an ordinary method. The printed circuit can be produced by, for example, a method involving: performing a processing step involving forming through-holes in the multilayer printed wiring board with a drill or laser; securing electrical connection between both sides of the resultant by a known step such as electroless copper plating; and implementing a part such as a device.

The composite woven fabric of the present invention has an extremely light weight, and is useful in reducing the weight of a printed wiring board because the composite woven fabric uses a quartz glass having a smaller specific gravity than that of any other glass, and polyolefin having a lighter weight than that of the quartz glass.

Polyolefin is excellent in electrical characteristics, but cannot be used as it is as a woven fabric for a printed wiring board owing to its low melting point. However, the composite woven fabric of the present invention obtained by commingling or combined weaving the quartz glass fibers and the polyolefin fibers can be used as a base material for a printed wiring board because of the following reason: even at the time of drying under heat in the prepreg production step or solder reflow in an implementation step, a printed wiring board the surface of which is coated with a thermosetting resin is obtained, so polyolefin does not thermally decompose.

In addition, even when polyolefin melts as a result of a heat-pressure treatment in the lamination step or build-up step, the composite woven fabric contains the quartz glass fibers, so polyolefin does not fluidize together with the thermosetting resin, and a printed wiring board excellent in dimensional stability can be obtained.

Further, through-holes and the like are formed in a printed wiring board by drilling. However, the conventional quartz glass cloth is so hard as to be poor in drilling property and to hasten the wear of a drill. Accordingly, the hardness is responsible for an increase in production cost for a printed wiring board. In contrast, the composite woven fabric of the present invention contains polyolefin at a certain ratio, so the ratio of the quartz glass fibers is small, and the drilling property of the composite woven fabric can be considerably improved. As a result, the total cost for the production of a printed wiring board can be reduced. Further, a thin woven fabric having a thickness of 100 μm or less can be suitably used in processing with laser, and enables an additional reduction in cost for a printed wiring board.

EXAMPLES

Hereinafter, the present invention will be described more specifically by way of examples. However, these examples are merely exemplary, and it goes without saying that the examples should not be construed as being limitative.

Example 1

Quartz glass fiber strands each composed of 200 filaments each having a diameter of 9 μm and polypropylene fiber strands each composed of 30 filaments each having a diameter of 20 μm were woven so that the number of vertical strands per inch might be 40, and the number of horizontal strands per inch might be 40. The quartz glass fibers used here each had a relative dielectric constant of 3.8 at 1 MHz and a relative dielectric constant of 3.9 at 1 GHz, and each had a dielectric loss tangent of $0.9 \times 10^{-4}$ at 1 MHz and a dielectric loss tangent of $1.0 \times 10^{-4}$ at 1 GHz. The polypropylene fibers used here each had a relative dielectric constant of 2.6 and a dielectric loss tangent of $5.0 \times 10^{-4}$ at 1 MHz. The relative dielectric constant and the dielectric loss tangent were measured in a bulk body of a quartz glass and polypropylene in conformance with JIS R1641 "Method of testing fine ceramic substrate for microwave dielectric characteristic" by a cavity resonance method.

The thickness and weight of the woven fabric thus produced were measured in conformance with JIS R3420 "General method of testing glass fibers". The content of the quartz glass fibers in the woven fabric was determined by calculation from the volumes of the quartz glass fibers and the polyolefin fibers used in the woven fabric. Table 1 shows the results.

The surface of the above woven fabric was treated with a KBM603 (manufactured by Shin-Etsu Chemical Co., Ltd.: trade name). Next, the resultant was impregnated with thermosetting resin varnish and dried, whereby a prepreg (B stage) was obtained.

The thermosetting resin varnish was prepared by using 75 parts by weight of a polyphenylene ether modified product, 1.5 parts by weight of maleic anhydride, 1.0 part by weight of 2,5-dimethyl-2,5-dihexane, 25 parts by weight of triallyl isocyanurate, 2.0 parts by weight of butylperoxy-m-isopropylbenzene, and 20 parts by weight of decabromodiphenyl ethane.

Four prepregs of the above kind were superimposed, and the resultant was molded with a vacuum pressing machine under heat and pressure, whereby a printed wiring board was produced.

The linear expansion coefficient, relative dielectric constant, and dielectric loss tangent of the printed wiring board thus produced were measured in conformance with JIS C6481 "Method of testing copper-clad laminated plate for printed wiring board". It should be noted that the relative dielectric constant and the dielectric loss tangent were measured at frequencies from 1 MHz to 10 GHz. Table 2 shows the results.

In addition, the printed wiring board thus produced was subjected to boring by drilling 2,000 times, and the worn state of the tip of a drill was observed with a microscope. Table 2 shows the results. Evaluation criteria for drilling property in Table 2 are as described below.

⊚: Nearly no wear of the drill is observed.
○: Slight wear of the drill is observed.
Δ: The wear of the drill is observed.
x: The wear of the drill is remarkable.

Example 2

80 quartz glass filaments each having a diameter of 9 μm and 30 polypropylene filaments each having a diameter of 20 μm were plied so that the number of twists per inch might be 1.0. The resultant combined filament yarns were woven so that the number of vertical strands per inch might be 40, and the number of horizontal strands per inch might be 40. Then, a prepreg and a printed wiring board were each produced in the same manner as in Example 1, and various characteristics were measured in the same manner as in Example 1. Tables 1 and 2 show the results.

Example 3

Quartz glass fiber strands each composed of 400 filaments each having a diameter of 9 μm as horizontal strands, and combined filament yarns each composed of 250 quartz glass filaments each having a diameter of 9 μm and 30 polypropylene filaments each having a diameter of 20 μm as vertical strands were woven so that the number of vertical strands per inch might be 44, and the number of horizontal strands per inch might be 31. Then, a prepreg and a printed wiring board were each produced in the same manner as in Example 1, and various characteristics were measured in the same manner as in Example 1. Tables 1 and 2 show the results.

Example 4

40 quartz glass filaments each having a diameter of 9 μm and 60 polypropylene filaments each having a diameter of 20 μm were plied so that the number of twists per inch might be 1.0. The resultant combined filament yarns were woven so that the number of vertical strands per inch might be 44, and the number of horizontal strands per inch might be 31. Then, a prepreg and a printed wiring board were each produced in the same manner as in Example 1, and various characteristics were measured in the same manner as in Example 1. Tables 1 and 2 show the results.

Example 5

Quartz glass fiber strands each composed of 200 filaments each having a diameter of 4 μm, and polypropylene fiber strands each composed of 30 filaments each having a diameter of 10 μm were woven so that the number of vertical strands per inch might be 75, and the number of horizontal strands per inch might be 75. Then, a prepreg and a printed wiring board were each produced in the same manner as in Example 1, and various characteristics were measured in the same manner as in Example 1. Tables 1 and 2 show the results.

Example 6

Quartz glass fiber strands each composed of 200 filaments each having a diameter of 14 μm, and polypropylene fiber strands each composed of 100 filaments each having a diameter of 20 μm were woven so that the number of vertical strands per inch might be 39, and the number of horizontal strands per inch might be 30. Then, a prepreg and a printed wiring board were each produced in the same manner as in Example 1, and various characteristics were measured in the same manner as in Example 1. Tables 1 and 2 show the results.

Example 7

An experiment was performed in the same manner as in Example 1 except that polyethylene fibers each having a relative dielectric constant of 2.4 and a dielectric loss tangent of $4.0 \times 10^{-4}$ at 1 MHz were used instead of the polypropylene fibers. Tables 1 and 2 show the results.

Example 8

An experiment was performed in the same manner as in Example 1 except that polystyrene fibers each having a relative dielectric constant of 2.4 and a dielectric loss tangent of $5.0 \times 10^{-4}$ at 1 MHz were used instead of the polypropylene fibers. Tables 1 and 2 show the results.

Comparative Example 1

Quartz glass fiber strands each composed of 200 filaments each having a diameter of 9 μm were woven so that the number of vertical strands per inch might be 40, and the number of horizontal strands per inch might be 40. Then, a prepreg and a printed wiring board were each produced in the same manner as in Example 1, and various characteristics were measured in the same manner as in Example 1. Tables 1 and 2 show the results.

Comparative Example 2

Polypropylene fibers each composed of 30 filaments each having a diameter of 30 μm were twisted 1.0 time per inch. The resultant polypropylene fiber strands were woven so that the number of vertical strands per inch might be 40, and the number of horizontal strands per inch might be 40. Then, a prepreg was produced in the same manner as in Example 1. The resultant prepreg was molded with a vacuum pressing machine under heat and pressure. As a result, the polypropylene fibers melted, and no printed wiring board could be obtained.

TABLE 1

Composite woven fabric

| | Content of quartz glass fibers (vol %) | Thickness (μm) | Weight (g/m²) |
|---|---|---|---|
| Example 1 | 57 | 90 | 66 |
| Example 2 | 35 | 90 | 54 |
| Example 3 | 78 | 175 | 151 |
| Example 4 | 12 | 175 | 83 |
| Example 5 | 52 | 20 | 12 |
| Example 6 | 49 | 128 | 78 |
| Example 7 | 57 | 90 | 67 |
| Example 8 | 57 | 90 | 69 |
| Comparative Example 1 | 100 | 90 | 88 |
| Comparative Example 2 | 0 | 90 | 36 |

TABLE 2

Printed wiring board

| | Linear expansion coefficient (ppm/° C.) | Relative dielectric constant maximum/minimum | Dielectric loss tangent ($\times 10^{-3}$) maximum/minimum | Drilling property |
|---|---|---|---|---|
| Example 1 | 10 | 3.3/3.2 | 2.0/1.0 | ○ |
| Example 2 | 15 | 3.2/3.1 | 2.1/1.0 | ⊚ |
| Example 3 | 9 | 3.4/3.3 | 2.0/1.0 | Δ |
| Example 4 | 18 | 3.1/2.9 | 2.1/1.1 | ⊚ |
| Example 5 | 13 | 3.3/3.2 | 2.1/1.0 | ○ |
| Example 6 | 13 | 3.3/3.1 | 2.1/1.0 | ○ |
| Example 7 | 11 | 3.3/3.2 | 2.0/1.0 | ○ |
| Example 8 | 11 | 3.3/3.2 | 2.0/1.0 | ○ |
| Comparative Example 1 | 6 | 3.6/3.4 | 2.0/0.9 | X |
| Comparative Example 2 | — | — | — | — |

The invention claimed is:

1. A composite woven fabric, comprising:
    quartz glass fibers including quartz glass fibers each having a relative dielectric constant of 3.9 or less at 1 MHz and a relative dielectric constant of 4.0 or less at 1 GHz and the quartz glass fibers each having a dielectric loss tangent of $1.5 \times 10^{-4}$ or less at 1 MHz and a dielectric loss tangent of $2.0 \times 10^{-4}$ or less at 1 GHz; and
    polyolefin fibers consisting of one of polyethylene fibers, polypropylene fibers, or polystyrene fibers, and wherein the polyolefin fibers each have a relative dielectric constant of 3.0 or less and a dielectric loss tangent of $3 \times 10^{-3}$ or less at 1 MHz;
    wherein a ratio of the quartz glass fibers to the composite woven fabric is 10 vol. % or more and 90 vol. % or less.

2. A composite woven fabric according to claim 1, wherein:
    the quartz glass fibers each have a filament diameter of 3 μm or more and 16 μm or less; and
    the composite woven fabric has a thickness of 200 μm or less.

3. A composite woven fabric according to claim 1, wherein the composite woven fabric is woven from combined filament yarns of the quartz glass fibers and the polyolefin fibers.

4. A composite woven fabric according to claim 1, wherein the composite woven fabric comprises a union fabric of quartz glass fiber strands and polyolefin fiber strands.

5. A composite woven fabric according to claim 1, wherein the composite woven fabric comprises a union fabric of combined filament yarns of the quartz glass fibers and the polyolefin fibers, and quartz glass fiber strands and/or polyolefin fiber strands.

6. A composite woven fabric according to claim 1, wherein the composite woven fabric is used for a printed wiring board.

7. A printed wiring board comprising the composite woven fabric according to claim 1.

8. A printed wiring board according to claim 7, wherein the printed wiring board has a relative dielectric constant of 4.0 or less and a dielectric loss tangent of $3 \times 10^{-3}$ or less from 1 MHz to 10 GHz.

9. A composite woven fabric, comprising:
    quartz glass fibers including quartz glass fibers each having a relative dielectric constant of 3.9 or less at 1 MHz and a relative dielectric constant of 4.0 or less at 1 GHz and the quartz glass fibers each having a dielectric loss tangent of $1.5 \times 10^{-4}$ or less at 1 MHz and a dielectric loss tangent of $2.0 \times 10^{-4}$ or less at 1 GHz; and polyolefin fibers consisting of one of polyethylene fibers, polypropylene fibers, or polystyrene fibers, and wherein the polyolefin fibers each have a relative dielectric constant of 3.0 or less and a dielectric loss tangent of $3\times10^{-3}$ or less at 1 MHz;

wherein a ratio of the quartz glass fibers to the composite woven fabric is 10 vol. % or more and 90 vol. % or less, wherein the quartz glass fibers each have a filament diameter of 3 μm or more and 16 μm or less and the composite woven fabric has a thickness of 200 μm or less, and wherein the composite woven fabric is woven from combined filament yarns of the quartz glass fibers and the polyolefin fibers.

10. A composite woven fabric, comprising:

quartz glass fibers including quartz glass fibers each having a relative dielectric constant of 3.9 or less at 1 MHz and a relative dielectric constant of 4.0 or less at 1 GHz and the quartz glass fibers each having a dielectric loss tangent of $1.5\times10^{-4}$ or less at 1 MHz and a dielectric loss tangent of $2.0\times10^{-4}$ or less at 1 GHz; and polyolefin fibers consisting of one of polyethylene fibers, polypropylene fibers, or polystyrene fibers, and wherein the polyolefin fibers each have a relative dielectric constant of 3.0 or less and a dielectric loss tangent of $3\times10^{-3}$ or less at 1 MHz, wherein a ratio of the quartz glass fibers to the composite woven fabric is 10 vol. % or more and 90 vol. % or less, wherein the quartz glass fibers each have a filament diameter of 3 μm or more and 16 μm or less and the composite woven fabric has a thickness of 200 μm or less, wherein the composite woven fabric is woven from combined filament yarns of the quartz glass fibers and the polyolefin fibers, and wherein the composite woven fabric is used for a printed wiring board.

11. A printed wiring board produced by using the composite woven fabric comprising:

quartz glass fibers including quartz glass each having a relative dielectric constant of 3.9 or less at 1 MHz and a relative dielectric constant of 4.0 or less at 1 GHz and the quartz glass fibers each having a dielectric loss tangent of $1.5\times10^{-4}$ or less at 1 MHz and a dielectric loss tangent of $2.0\times10^{-4}$ or less at 1 GHz; and polyolefin fibers consisting of one of polyethylene fibers, polypropylene fibers, or polystyrene fibers, and wherein the polyolefin fibers each have a relative dielectric constant of 3.0 or less and a dielectric loss tangent of $3\times10^{-3}$ or less at 1 MHz, wherein a ratio of the quartz glass fibers to the composite woven fabric is 10 vol. % or more and 90 vol. % or less, wherein the quartz glass fibers each have a filament diameter of 3 μm or more and 16 μm or less and the composite woven fabric has a thickness of 200 μm or less, wherein the composite woven fabric is woven from combined filament yarns of the quartz glass fibers and the polyolefin fibers, and wherein the composite woven fabric is used for a printed wiring board.

* * * * *